United States Patent
Ookado et al.

(10) Patent No.: US 11,558,967 B2
(45) Date of Patent: Jan. 17, 2023

(54) ELECTRONIC EQUIPMENT AND ELECTRONIC CONTROL DEVICE

(71) Applicant: DIAMOND & ZEBRA ELECTRIC MFG. CO., LTD., Osaka (JP)

(72) Inventors: Yuuki Ookado, Osaka (JP); Tatsuya Ooue, Osaka (JP); Hiroki Nakata, Osaka (JP)

(73) Assignee: DIAMOND & ZEBRA ELECTRIC MFG. CO., LTD., Osaka (JP)

( * ) Notice: Subject to any disclaimer, the term of this patent is extended or adjusted under 35 U.S.C. 154(b) by 139 days.

(21) Appl. No.: 16/826,836

(22) Filed: Mar. 23, 2020

(65) Prior Publication Data

US 2021/0014984 A1 Jan. 14, 2021

(30) Foreign Application Priority Data

Jul. 10, 2019 (JP) .............................. JP2019-128706

(51) Int. Cl.
*H05K 7/20* (2006.01)
*H05K 5/00* (2006.01)
(Continued)

(52) U.S. Cl.
CPC ............ *H05K 5/0069* (2013.01); *H02M 7/44* (2013.01); *H05K 1/0203* (2013.01); *H05K 7/2089* (2013.01)

(58) Field of Classification Search
CPC ........................ H05K 7/209; H01L 2023/4031
See application file for complete search history.

(56) References Cited

U.S. PATENT DOCUMENTS 4,563,725 A * 1/1986 Kirby .................. H01L 23/4006
174/16.3
4,972,294 A * 11/1990 Moses, Jr. ........... H01L 23/4093
165/80.3
(Continued)

FOREIGN PATENT DOCUMENTS

EP       1608014 A1 * 12/2005 ............. H05K 7/209
EP       2172971 A2 *  4/2010 ............ H01L 25/115
(Continued)

OTHER PUBLICATIONS

Extended European Search Report issued in corresponding European Patent Application No. 20157664.2-1203, dated Sep. 21, 2020.

*Primary Examiner* — Robert J Hoffberg
(74) *Attorney, Agent, or Firm* — McDermott Will & Emery LLP

(57) ABSTRACT

Electronic equipment includes a plurality of heat generating elements, a single heat sink, and a single cover. The heat generating elements are arranged adjacent to one another in a one-dimensional array in a predetermined alignment direction. The faces of the heat generating elements on one side are fixed directly or indirectly to the heat sink. The faces of the heat generating elements on the other side are in direct or indirect contact with the cover. The cover is fixedly screwed to the heat sink at opposite ends in the alignment direction on the outer side of the heat generating elements. The heat generating elements are sandwiched and held between the heat sink and the cover. This allows heat generated by the heat generating elements to be efficiently radiated via the heat sink and allows the heat generating elements to be easily connected to the heat sink.

4 Claims, 8 Drawing Sheets

(51) Int. Cl.
*H02M 7/44* (2006.01)
*H05K 1/02* (2006.01)

(56) References Cited

U.S. PATENT DOCUMENTS

| | | | | |
|---|---|---|---|---|
| 5,274,193 A | | 12/1993 | Bailey et al. | |
| 5,450,284 A | * | 9/1995 | Wekell | H01L 23/4006 |
| | | | | 257/719 |
| 6,043,981 A | * | 3/2000 | Markow | H01L 23/4006 |
| | | | | 165/80.3 |
| 7,206,204 B2 | * | 4/2007 | Nakatsu | H01L 23/4006 |
| | | | | 165/80.3 |
| 7,329,846 B2 | * | 2/2008 | Park | H01L 23/3672 |
| | | | | 219/622 |
| 7,715,196 B2 | * | 5/2010 | Chen | H01L 23/4093 |
| | | | | 361/719 |
| 2005/0264998 A1 | * | 12/2005 | McCutcheon | H01L 23/4006 |
| | | | | 361/702 |

FOREIGN PATENT DOCUMENTS

| | | |
|---|---|---|
| JP | 10-107189 A | 4/1998 |
| JP | 2015-118985 A | 6/2015 |
| JP | 2017-037946 A | 2/2017 |
| WO | 2010/119546 A1 | 10/2010 |

\* cited by examiner

ELECTRONIC EQUIPMENT AND ELECTRONIC CONTROL DEVICE

RELATED APPLICATIONS

This application claims the benefit of Japanese Application No. 2019-128706, filed on Jul. 10, 2019, the disclosure of which is incorporated by reference herein.

BACKGROUND OF THE INVENTION

Field of the Invention

The present invention relates to electronic equipment and an electronic control device in which a circuit board implementing electronic equipment is housed in a case.

Description of the Background Art

Various electronic control devices have conventionally been installed in complex-structured systems such as automobiles and industrial equipment. For example, automobiles install power converters such as DC-AC inverters that enable direct-current voltages supplied from internal batteries serving as on-vehicle power supplies to be converted into alternating-current voltages while being boosted and to be supplied to various types of electrical equipment such as portable battery chargers, lighting equipment, and audio equipment.

The DC-AC inverters implement heat sinks and various electrical elements such as FETs and diodes. These electrical elements are heat generating elements that generate heat when a large current flows through the elements during operation. The heat sinks are heat radiating members that radiate heat generated by the heat generating elements. A configuration of such a heat sink is disclosed in, for example, Japanese Patent Application Laid-Open No. 2017-037946.

A heat sink (60) used in a power converter (1) disclosed in Japanese Patent Application Laid-Open No. 2017-037946 includes a plate-like mounting part (61), a plurality of radiating fins (62) disposed on the underside of the mounting part (61), and a contact part (63) protruding upward from the upper face of the mounting part (61). A first ground part (743) and a second ground part (753) that extend from a transformer (30) are each fixedly screwed to the contact part (63), which is integrally formed with the mounting part (61) of the heat sink (60). This allows heat generated by an internal coil (32) of the transformer (30) to be radiated to the outside via the first or second ground part (743) or (753), the contact part (63), and the heat sink (60) (see FIG. 2 and paragraphs 0041 and 0056 to 0058).

However, screws used to screw the first ground part (743) and the second ground part (753) to the contact part (63) are located on a path through which heat is transmitted from the transformer (30) to the heat sink (60). Thus, the presence of these screws may deteriorate thermal conductivity from the transformer (30) to the heat sink (60). Besides, it is necessary to screw the first ground part (743) and the second ground part (753) to the heat sink (60) during assembly of the converter, which may reduce working efficiency.

SUMMARY OF THE INVENTION

It is an object of the present invention to provide a technique that enables heat generated by heat generating elements used in electronic equipment to be efficiently radiated via a heat sink and also enables the heat generating elements to be easily connected to the heat sink.

To solve the above-described problems, a first aspect of the present invention is electronic equipment that includes a plurality of heat generating elements arranged adjacent to one another in a one-dimensional array in a predetermined alignment direction, a single heat sink fixed directly or indirectly to faces of the plurality of heat generating elements on one side, the faces being parallel to the alignment direction, and a single cover in direct or indirect contact with faces of the plurality of heat generating elements on the other side, the faces being parallel to the alignment direction. The cover is fixedly screwed to the heat sink at opposite ends in the alignment direction on an outer side of the plurality of heat generating elements. The plurality of heat generating elements are sandwiched and held between the heat sink and the cover.

According to the first aspect of the present invention, the heat generating elements are fixedly screwed to the heat sink by one operation, using the cover. Thus, a structure can be formed in which the screws are not located on a path through which heat is transmitted from the heat generating elements to the heat sink. This allows efficient heat transmission to the heat sink without the screws becoming obstacles. It is also possible to reduce the number of parts used when fixing the heat generating elements and to increase working efficiency, which leads to a cost reduction.

These and other objects, features, aspects and advantages of the present invention will become more apparent from the following detailed description of the present invention when taken in conjunction with the accompanying drawings.

DESCRIPTION OF THE PREFERRED EMBODIMENTS

Exemplary embodiments of the present invention will be described hereinafter with reference to the drawings. In the present invention, the shape of each part and the positional relationship of these parts are described based on the assumption that an insertion direction of a plug of external equipment into a later-described input or output connector (see FIGS. 1 and 2 described later) is defined as a forward direction, and a direction opposite to the forward direction as a backward direction.

1. First Embodiment

Figure 1:
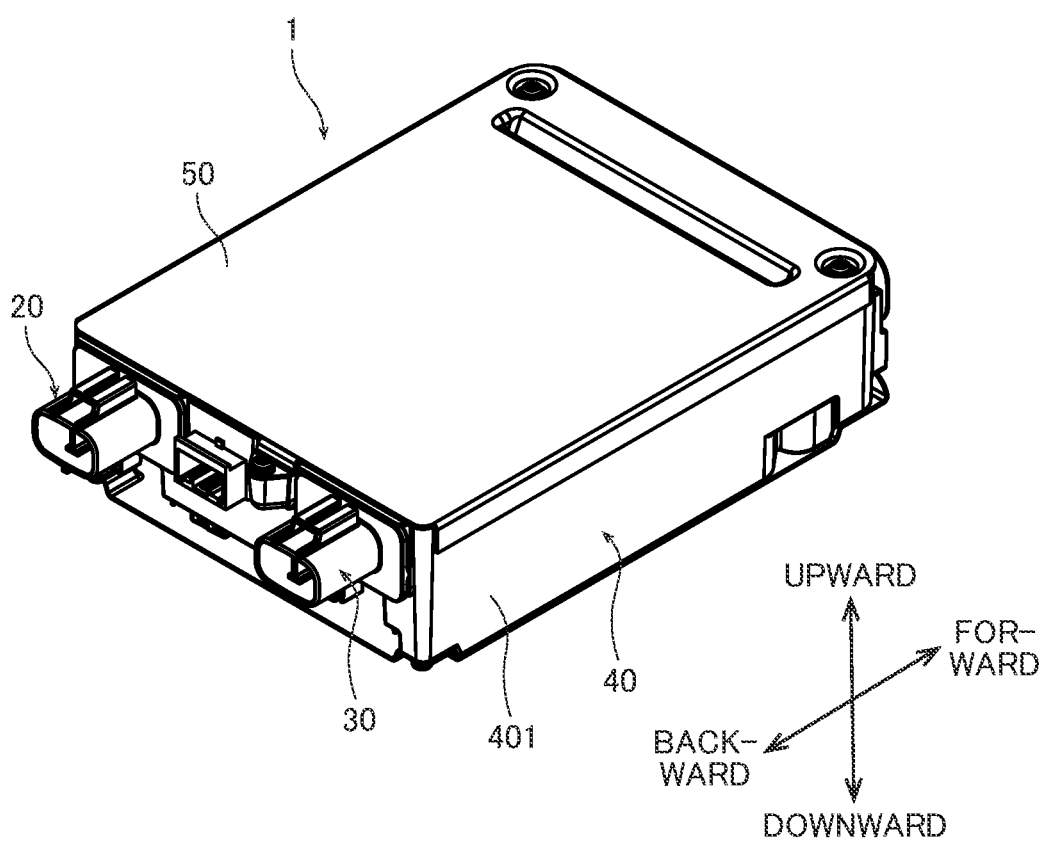
FIG. 1 is a perspective view of an electronic control device according to a first embodiment.
Figure 2:
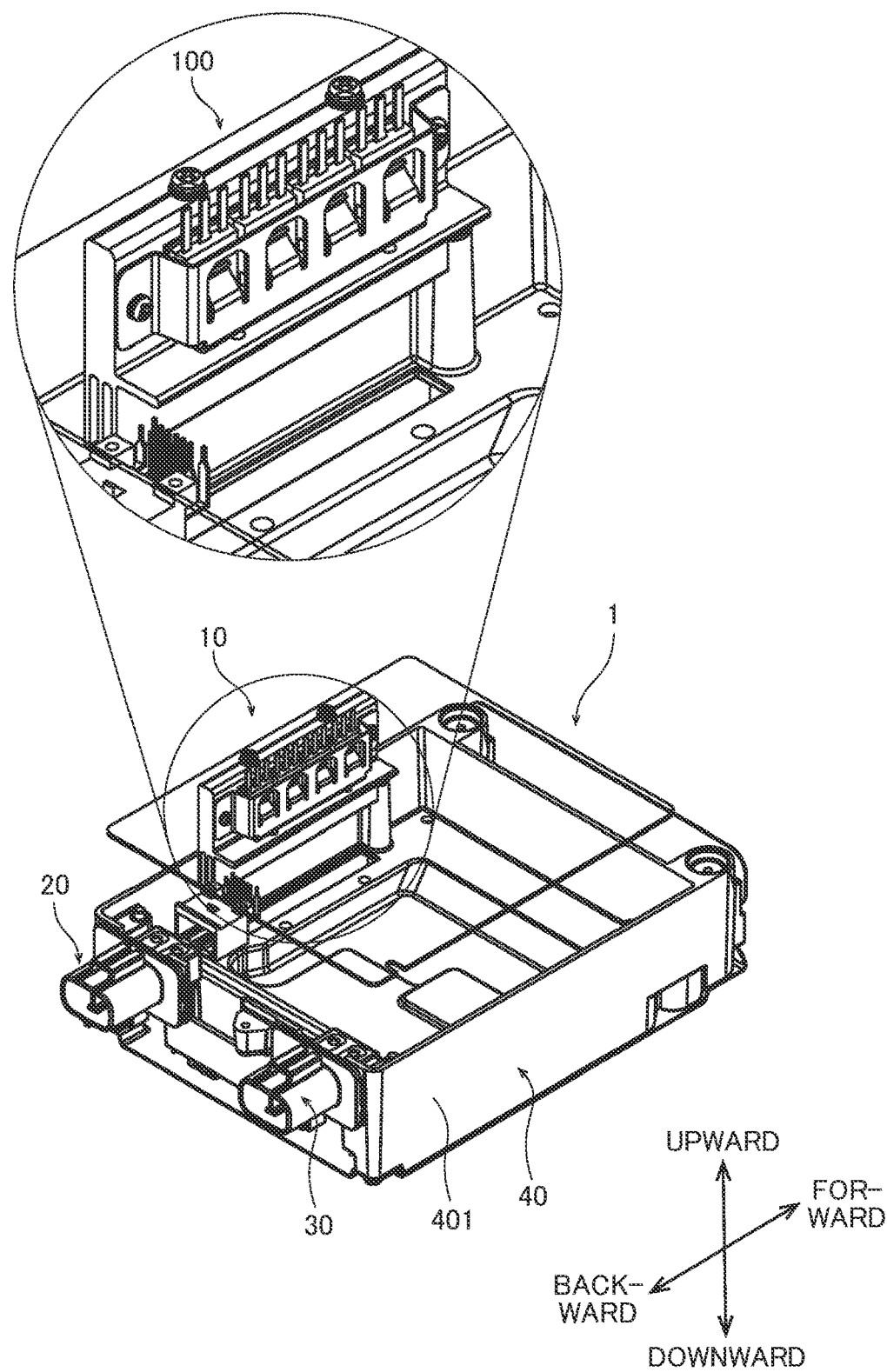
FIG. 2 is a partially enlarged perspective view of the electronic control device according to the first embodiment.

First, a configuration of a power converter 1 (DC-AC inverter), which is a first embodiment of the electronic control device according to the present invention, will be described with reference to the drawings. FIG. 1 is a perspective view of the power converter 1 (DC-AC inverter) according to the first embodiment. FIG. 2 is a partially enlarged perspective view of the power converter 1 according to the first embodiment, with a later-described lid part 50 removed.

For example, the power converter 1 according to the present embodiment is mounted on an automobile. The automobile includes an internal battery serving as a power supply device. The internal battery is a storage battery capable of being charged and discharged with direct-current power. The power converter 1 is a device that enables a constant (e.g., 12 volt) direct-current voltage supplied from the internal battery to be converted into an alternating-current voltage while being boosted up to approximately 100 volt and to be supplied to various types of electrical equipment such as a portable battery charger, lighting equipment, and audio equipment. Such electrical equipment is hereinafter referred to as "external equipment."

Alternatively, the power converter 1 may be a DC-DC converter that is mounted on a plug-in electric automobile such as a plug-in hybrid electric vehicle (HEV) or a plug-in electric vehicle (EV), and that enables a direct-current input voltage input from a high-voltage electric power system to be converted into a direct-current output voltage while being stepped down and to be output to a low-voltage electric power system. As another alternative, the electronic control device may be a device that performs control other than power conversion. As yet another alternative, the electronic control device may be a device used in industrial equipment other than automobiles.

As illustrated in FIGS. 1 and 2, the power converter 1 includes a circuit board 10, two connectors (an input connector 20 and an output connector 30), a case 40, and the lid part 50.

The circuit board 10 according to the present embodiment is a DC-AC inverter circuit board. The circuit board 10 includes a portion housed inside the case 40 and a portion fixed to the lower face of the lid part 50. On the surface of the circuit board 10, a pattern made of an electrically conductive metal is formed, and various electronic components are disposed. For example, copper is used as the electrically conductive metal. The input connector 20 is connected to the plug of a cable that extends from the aforementioned internal battery. The output connector 30 is connected to the plug of a cable that extends from the aforementioned external equipment. The circuit board 10 and parts of the input connector 20 and the output connector 30 are housed inside the case 40, and when the lid part 50 is closed, the electronic components mounted on the circuit board 10, the input connector 20, and the output connector 30 are electrically connected to one another by the pattern on the circuit board 10.

Accordingly, an electric circuit with desired functions is formed. In the present embodiment, a circuit capable of power conversion is formed. As a result, the power converter 1 is capable of converting a direct-current input voltage that is input via the input connector 20 into an alternating-current voltage while boosting the input voltage, and outputting the alternating-current voltage to the external equipment via the output connector 30.

Figure 3:
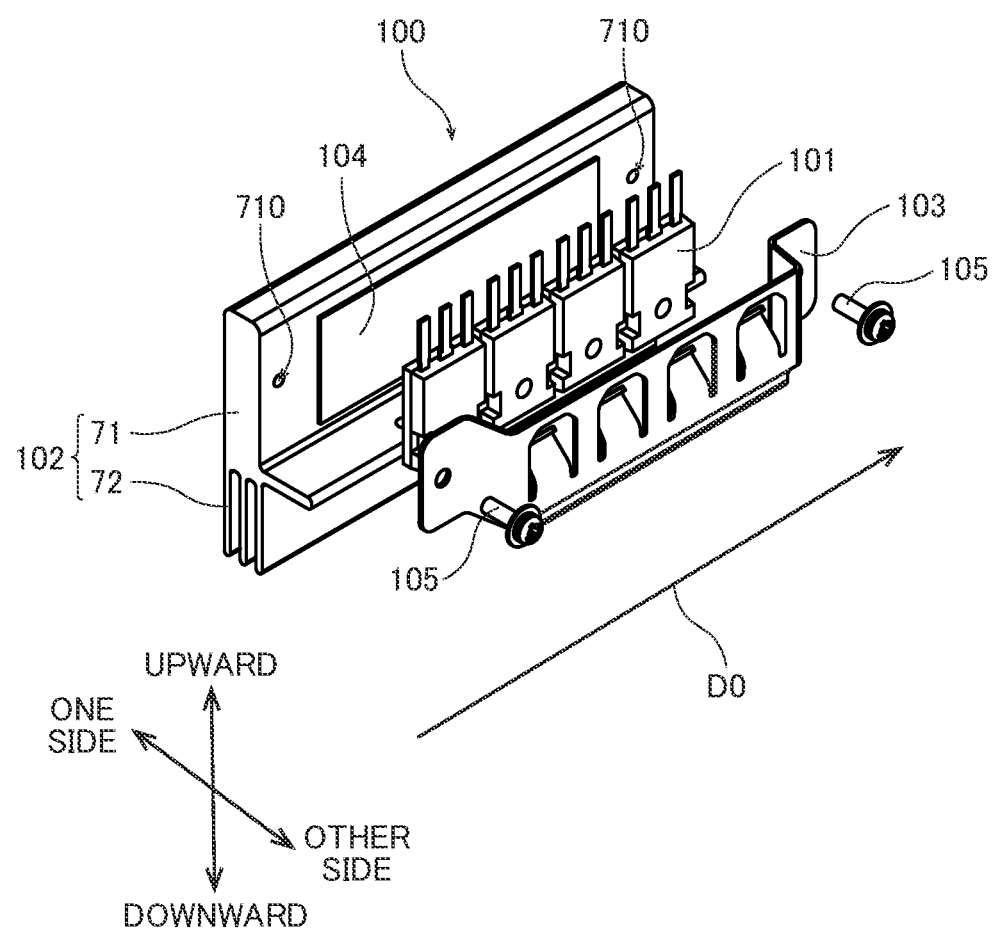
FIG. 3 is an exploded perspective view of electronic equipment according to the first embodiment.

The circuit board 10 implements electronic equipment 100. According to the present invention, a unit composed of a plurality of components mounted on the circuit board 10 is referred to as "electronic equipment." FIG. 3 is a partially exploded perspective view of the electronic equipment 100 according to the first embodiment. As illustrated in FIG. 3, the electronic equipment 100 includes a plurality of (in the present embodiment, four) heat generating elements 101, a single heat sink 102, and a single cover 103. The heat generating elements 101 are, for example, FETs or diodes and generate heat when a large current flows through the elements during operation. The number of heat generating elements 101 included in the electronic equipment 100 however may be two or three, or five or more.

The heat sink 102 is a heat radiating member for radiating heat generated by the four heat generating elements 101. The heat sink 102 is formed of a metal with excellent thermal conductivity, such as an aluminum alloy or steel. The heat sink 102 is also electrically grounded. The heat sink 102 includes a plate-like part 71 and a plurality of (in the present embodiment, three) radiating fins 72.

The plate-like part 71 is a plate-like member that extends in an up-down direction and in parallel with a side face 401 of the case 40. The side face 401 extends in the forward and backward directions as illustrated in FIGS. 1 and 2. The radiating fins 72 are plate-like members each protruding downward from the lower end of the plate-like part 71 and extending in an up-down direction and in parallel with the aforementioned side face 401. In the present embodiment, the radiating fins 72 are formed of a single member with the plate-like part 71. The radiating fins 72 however may be formed of a member that is separate from the plate-like part 71 as long as they are contiguous with and thermally connected to the plate-like part 71. That is, it is only necessary for the radiating fins 72 to be capable of conducting heat to the plate-like part 71.

In the manufacture of the power converter 1, first, the four heat generating elements 101 are arranged adjacent to one another in a one-dimensional array in a predetermined alignment direction D0. In the present embodiment, the four heat generating elements 101 are arranged in a one-dimensional array parallel to the side face 401, which extends in the forward and backward directions of the case 40. The faces of the four heat generating elements 101 on one side, which are parallel to the alignment direction D0, oppose the plate-like part 71 of the heat sink 102.

Note that two screws holes 710 are provided in the vicinity of the ends of the face of the plate-like part 71 of the heat sink 102, the face opposing the four heat generating elements 101. Also, a heat radiation sheet 104 is mounted on the face of the plate-like part 71 of the present embodiment that opposes the four heat generating elements 101. The heat radiation sheet 104 has higher thermal conductivity than air. Accordingly, after the cover 103 is fixed to the heat sink 102 as will be described later, it is possible to inhibit clearance for the air to flow in from being formed between the four heat generating elements 101 and the heat sink 102, and to efficiently transmit the heat generated by the four heat generating elements 101 to the heat sink 102.

Figure 4:
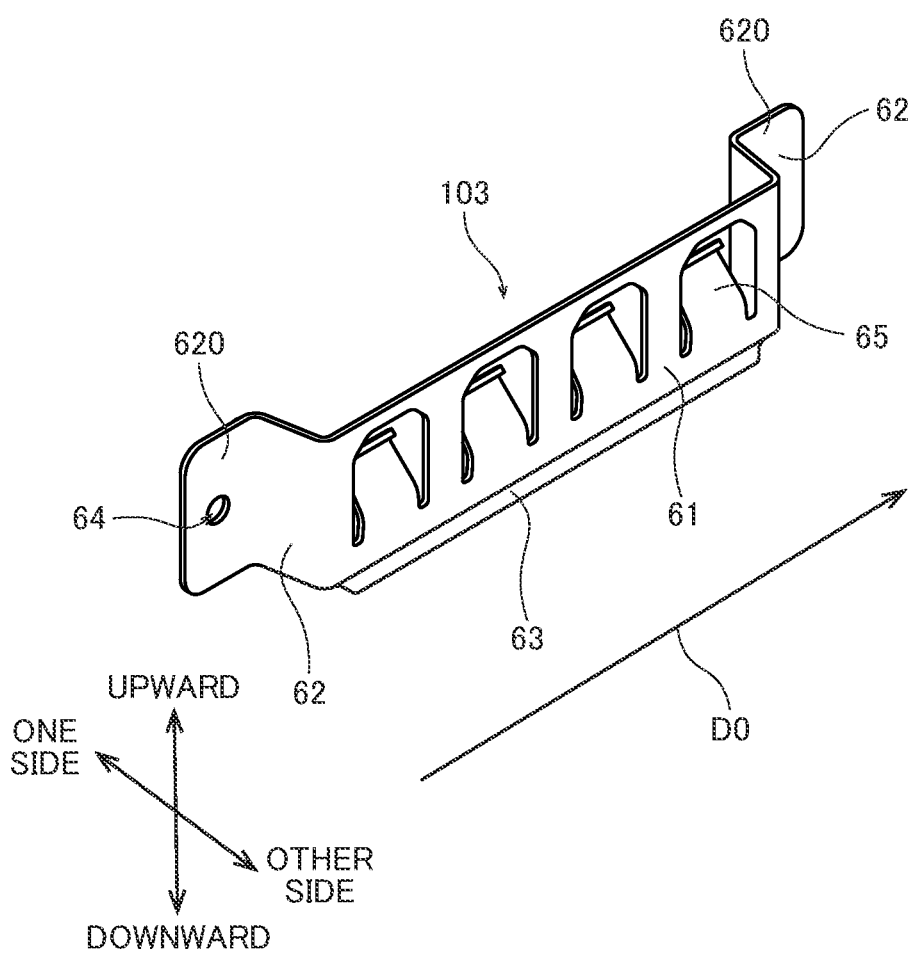
FIG. 4 is a perspective view of a cover according to the first embodiment.

FIG. 4 is a perspective view of the cover 103 according to the first embodiment. As illustrated in FIG. 4, the cover 103 includes a cover body 61, two cover protrusions 62, and a cover bottom part 63. The cover body 61, the two cover protrusions 62, and the cover bottom part 63 are formed of a single member. For example, the cover 103 according to the present embodiment is made of a metal using stainless steel. Thus, the cover 103 can be easily formed by press working.

The cover body 61 is a plate-like portion that extends in the aforementioned alignment direction D0 on the side of the four heat generating elements 101 opposite to the aforementioned one side. That is, the cover body 61 extends in the alignment direction D0 on the other side of the four heat generating elements 101. The two cover protrusions 62 are portions that extend toward the one side from the opposite ends of the cover body 61 in the alignment direction D0. Each of the two cover protrusions 62 has a fixation face 620. The fixation faces 620 extend in the alignment direction D0. Each of the two fixation faces 620 has a through hole 64. Each through hole 64 penetrates the fixation face 620 in the thickness direction.

The two fixation faces 620 are screwed via the aforementioned through holes 64 into the screw holes 710 of the heat sink 102, using metal screws 105 (see FIG. 3). Accordingly, the cover 103 is fixedly screwed to the heat sink 102 at opposite ends in the alignment direction D0 on the outer side of the four heat generating elements 101 so as to cover the four heat generating elements 101. As a result, the faces of the four heat generating elements 101 on the one side, which are parallel to the alignment direction D0, are indirectly fixed to the plate-like part 71 of the single heat sink 102 via the heat radiation sheet 104. The use of the heat radiation sheet 104 is, however, not an absolute requirement. That is, the aforementioned faces of the four heat generating elements 101 on the one side may be directly fixed to the single heat sink 102, without the heat radiation sheet 104 therebetween. In the present embodiment, the faces of the four heat generating elements 101 on the other side are in direct contact with the cover body 61. Thus, the four heat generating elements 101 are sandwiched and held between the heat sink 102 and the cover 103 in a stable manner.

After the electronic equipment 100 is implemented on the circuit board 10, heat generated by each of the four heat generating elements 101 during operation of the circuit board 10 is transmitted via the aforementioned heat radiation sheet 104 to the heat sink 102 and radiated into outside air from the radiating fins 72 of the heat sink 102. This suppresses a temperature rise in the heat generating elements 101 during operation of the circuit board 10, thereby reducing the possibility that other members in the power converter 1 are adversely affected by such a temperature rise. Besides, according to the present embodiment, it is also possible to enable applying pressure to arbitrary parts and adjusting the amount of pressure to be applied, which has been impossible with conventional structures in which each heat generating element 101 is fixed by screwing.

As described above, in the present embodiment, the four heat generating elements 101 are fixedly screwed to the heat sink 102 by one operation at the opposite ends in the alignment direction D0 on the outer side of the four heat generating elements 101, using the single cover 103 and the two screws 105. Accordingly, a structure is formed in which the screws 105 are not located on a path through which heat is transmitted from the four heat generating elements 101 to the heat sink 102. This allows efficient heat transmission from the heat generating elements 101 to the heat sink 102 without the screws 105 becoming obstacles. As a result, heat generated by the four heat generating elements 101 is efficiently radiated to the outside of the power converter 1. It is also possible to improve workability at the time of fixing the four heat generating elements 101 to the heat sink 102, to reduce the number of parts used for the fixation, and to improve working efficiency. This leads to a cost reduction.

As illustrated in FIG. 4, the cover 103 according to the present embodiment further includes the cover bottom part 63. The cover bottom part 63 extends from the lower end of the cover body 61 toward the aforementioned one side and in a direction perpendicular to the cover body 61. This improves the rigidity of the cover 103 in the alignment direction D0 and allows the four heat generating elements 101 aligned in the alignment direction D0 to be pressed evenly. The cover bottom part 63 may be connected to the two cover protrusions 62. In this case, the strength of the cover 103 as a whole can be further improved.

The cover body 61 according to the present embodiment further includes a plurality of (in the present embodiment, four) cover pressure parts 65. The four cover pressure parts 65 are portions each protruding toward the one side from positions of the cover body 61 that oppose the four heat generating elements 101. That is, the four cover pressure parts 65 protrude toward the one side from a plurality of positions spaced from one another in the alignment direction D0. When the cover 103 is fixed to the heat sink 102, each of the four cover pressure parts 65 presses one of the heat generating elements 101 toward the one side. Accordingly, the four heat generating elements 101 can be held in a more stable manner. As a result, it is possible to prevent the heat generating elements 101 from being disconnected or falling off.

Figure 5:
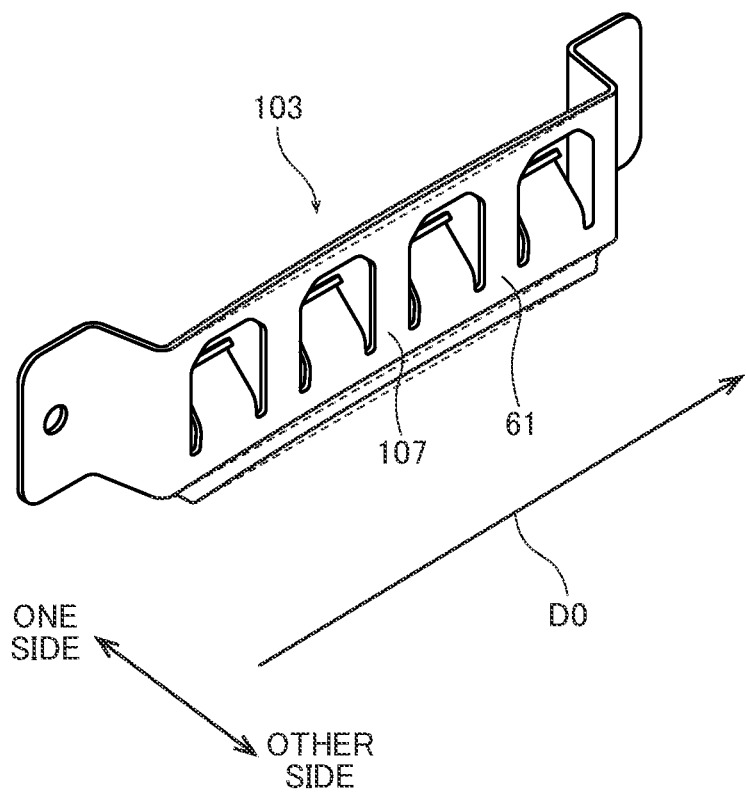
FIG. 5 is a perspective view of a cover according to a variation.

As a variation, the cover 103 may have a flat spring structure. For example, as illustrated in FIG. 5, the cover body 61 may have a curved surface 107 that protrudes toward the one side as approaching the central portion in the alignment direction D0. This allows the four heat generating elements 101 to be pressed toward the one side by the action of the flat spring of the cover body 61. Thus, the four heat generating elements 101 can be held in a more stable manner. As a result, it is possible to further prevent the heat generating elements 101 from being disconnected or falling off. Besides, the fixation of the four heat generating elements 101 and the heat sink 102 can be maintained more stably. This allows more efficient heat transmission from the four heat generating elements 101 to the heat sink 102.

2. Second Embodiment

Next, a configuration of a power converter according to a second embodiment of the present invention will be described. The power converter according to the second embodiment includes a circuit board, two connectors (an input connector and an output connector), a case, and a lid part. Note that components of the second embodiment other than electronic equipment 100B implemented on the circuit board are identical in configuration to the components of the first embodiment other than the electronic equipment 100, and therefore redundant descriptions thereof will be omitted.

Figure 6:
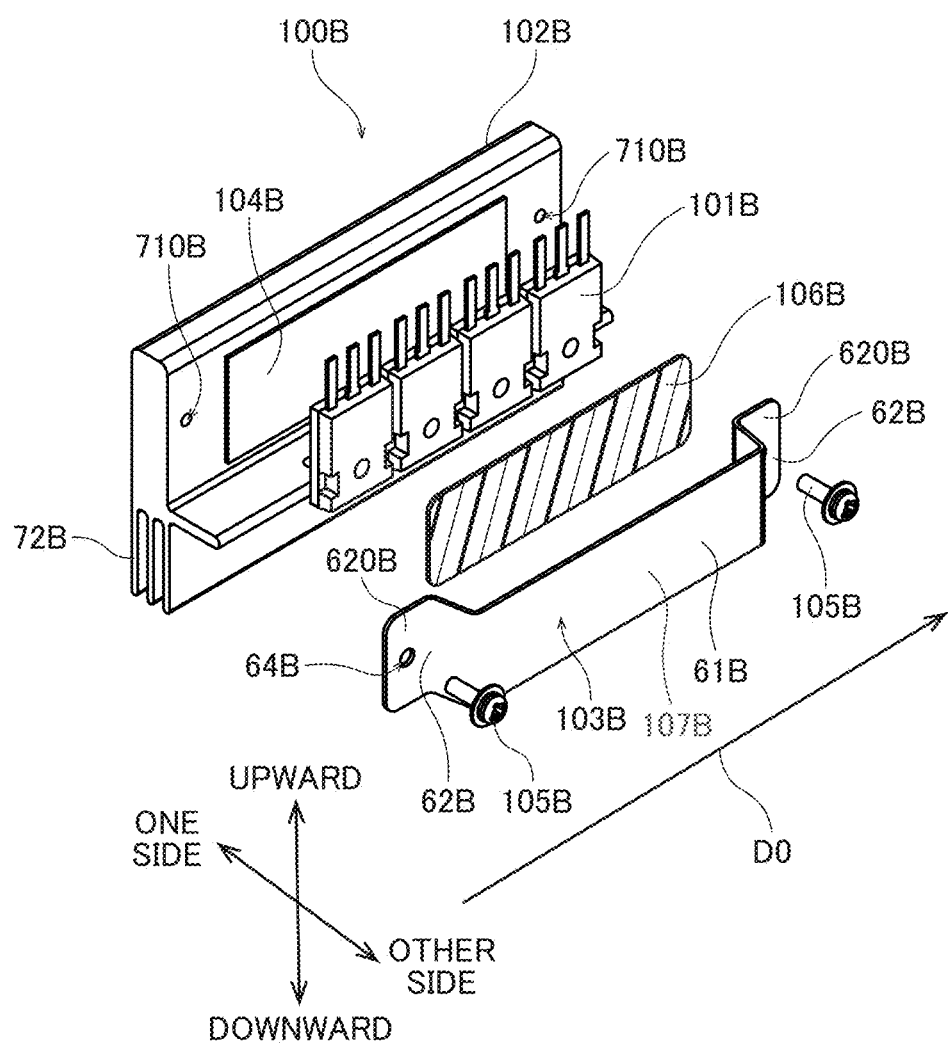
FIG. 6 is an exploded perspective view of electronic equipment according to a second embodiment.

FIG. 6 is a partially exploded perspective view of the electronic equipment 100B according to the second embodiment. As illustrated in FIG. 6, the electronic equipment 100B includes a plurality of (in the present embodiment, four) heat generating elements 101B, a single heat sink 102B, and a single cover 103B. The number of heat generating elements 101B included in the electronic equipment 100B however may be two or three, or five or more. The four heat generating elements 101B and the single heat sink 102B are identical in configuration to the four heat generating elements 101 and the single heat sink 102 of the first embodiment, and therefore redundant descriptions thereof will be omitted.

As illustrated in FIG. 6, the cover 103B according to the present embodiment includes a cover body 61B and two cover protrusions 62B. The cover body 61B and the two cover protrusions 62B are formed of a single member. The cover 103B according to the present embodiment is made of a metal. Thus, the cover 103B can be easily formed by press working. Besides, heat will be transmitted from the cover 103B to the heat sink 102B, and therefore heat radiation performance of the electronic equipment 100B as a whole can be further improved. The cover 103B according to the present embodiment does not include a portion equivalent to the cover bottom part 63 of the first embodiment.

The cover body 61B is a plate-like portion that extends in the predetermined alignment direction D0 of the four heat generating elements 101B on the other side of the four heat generating elements 101B. The "other side" as used herein is defined similarly to that in the first embodiment. The two cover protrusions 62B are portions that extend toward the one side from the opposite ends of the cover body 61B in the alignment direction D0. Each of the two cover protrusions 62B has a fixation face 620B. The fixation faces 620B extend in the alignment direction D0. Each of the two fixation faces 620B has a through hole 64B. Each through hole 64B penetrates the fixation face 620B in the thickness direction. In a pre-stage of the fixation of the cover 103B and the heat sink 102B, an adhesive 106B is applied in advance to at least either the face of the cover body 61B on the one side or the faces of the four heat generating elements 101B on the other side.

As illustrated in FIG. 6, the two fixation faces 620B are screwed via the aforementioned through holes 64B into screw holes 710B of the heat sink 102B, using metal screws 105B. Accordingly, the cover 103B is fixedly screwed to the heat sink 102B at opposite ends in the alignment direction D0 on the outer side of the four heat generating elements 101B so as to cover the four heat generating elements 101B. As a result, the faces of the four heat generating elements 101B on the one side, which are parallel to the alignment direction D0, are indirectly fixed to the single heat sink 102B via a heat radiation sheet 104B mounted on the heat sink 102B.

As described above, the adhesive 106B exists between the cover body 61B and the four heat generating elements 101B in the present embodiment. Therefore, when the cover 103B is fixed to the heat sink 102B, the cover 103B is in contact with the faces of the four heat generating elements 101B on the other side via the adhesive 106B. That is, the faces of the four heat generating elements 101B on the other side, which are parallel to the alignment direction D0, are in indirect contact with the cover body 61B via the adhesive 106B. As a result, the four heat generating elements 101B can be held in a more stable manner. This consequently prevents the heat generating elements 101B from being disconnected or falling off.

As in the first embodiment, heat generated by each of the four heat generating elements 101B during operation of the circuit board is transmitted to the heat sink 102B via the aforementioned heat radiation sheet 104B and radiated into outside air from a plurality of radiating fins 72B (see FIG. 6) of the heat sink 102B. This suppresses a temperature rise in the heat generating elements 101B during operation of the circuit board, thereby reducing the possibility that other members in the power converter are adversely affected by such a temperature rise.

As in the first embodiment, the four heat generating elements 101B are fixedly screwed to the heat sink 102B by one operation at the opposite ends in the alignment direction D0 on the outer side of the four heat generating elements 101B, using the single cover 103B and the two screws 105B. Accordingly, a structure is formed in which the screws 105B are not located on a path through which heat is transmitted from the four heat generating elements 101B to the heat sink 102B. This allows efficient heat transmission from the heat generating elements 101B to the heat sink 102B without the screws 105B becoming obstacles. As a result, heat generated by the four heat generating elements 101B can be efficiently radiated to the outside of the power converter. It is also possible to improve workability at the time of fixing the four heat generating elements 101B to the heat sink 102B, to reduce the number of parts used for the fixation, and to improve working efficiency. This leads to a cost reduction.

Moreover, the position of the lower end in the up-down direction of the cover body 61B according to the present embodiment is located above the positions of the lower ends of the four heat generating elements 101B in the up-down direction. This reduces space required for placement of the cover 103B. Accordingly, even in the power converter having limited space, it is possible to implement the electronic equipment 100B including the cover 103B on the circuit board.

As in the first embodiment, the cover 103B may have a flat spring structure. For example, the cover body 61B may have a curved surface 107B that protrudes toward the one side as approaching the central portion in the alignment direction D0. This allows the four heat generating elements 101B to be pressed toward the one side by the action of the flat spring of the cover body 61B. Accordingly, the four heat generating elements 101B can be held in a more stable manner. As a result, it is possible to further prevent the heat generating elements 101B from being disconnected or falling off. Besides, the fixation of the four heat generating elements 101B and the heat sink 102B can be maintained more stably. This allows more efficient heat transmission from the four heat generating elements 101B to the heat sink 102B.

3. Third Embodiment

Next, a configuration of a power converter according to a third embodiment of the present invention will be described. The power converter according to the third embodiment includes a circuit board 10C, two connectors (an input connector and an output connector), a case, and a lid part. Note that components of the third embodiment other than electronic equipment 100C implemented on the circuit board 10C are identical in configuration to the components of the first and second embodiments other than the electronic equipment, and therefore redundant descriptions thereof will be omitted.

Figure 7:
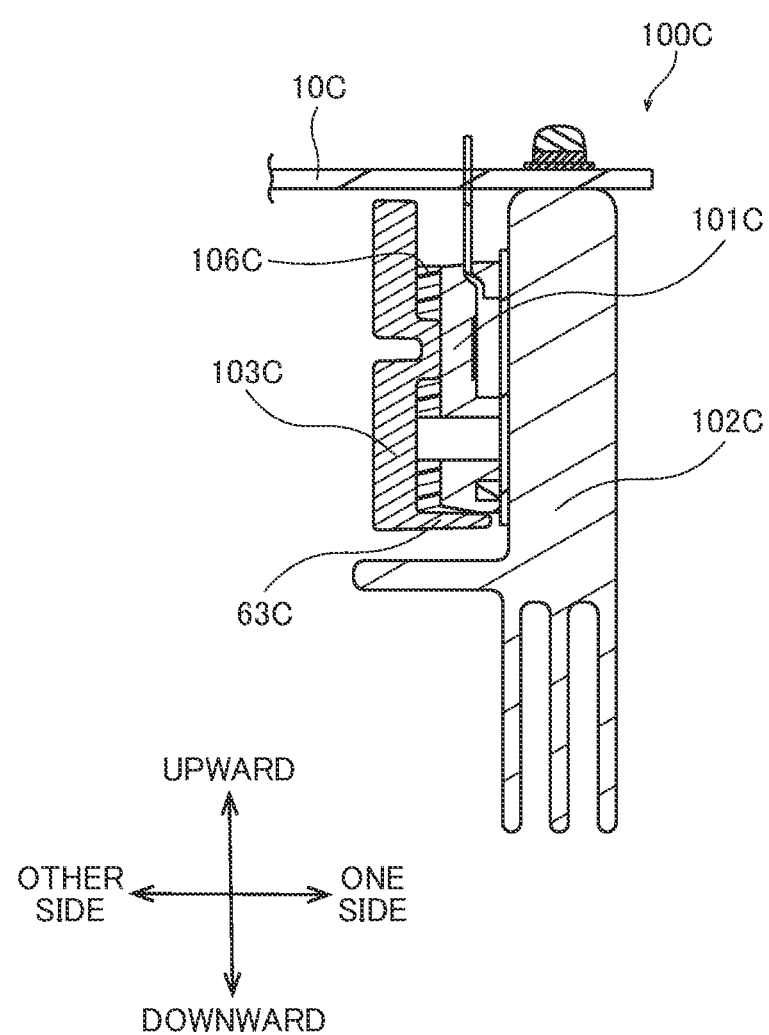
FIG. 7 is a partial longitudinal sectional view of a circuit board and electronic equipment according to a third embodiment.

FIG. 7 is a partial longitudinal sectional view of the circuit board 10C and the electronic equipment 100C implemented on the circuit board 10C according to the present embodiment. As illustrated in FIG. 7, the electronic equipment 100C includes a plurality of heat generating elements 101C, a single heat sink 102C, and a single cover 103C. The electronic equipment 100C according to the present embodiment includes four heat generating elements 101C. The number of heat generating elements 101C included in the electronic equipment 100C however may be two or three, or five or more. The four heat generating elements 101C and the single heat sink 102C are identical in configuration to the four heat generating elements and the single heat sink of the first and second embodiments, and therefore redundant descriptions thereof will be omitted.

Figure 8:
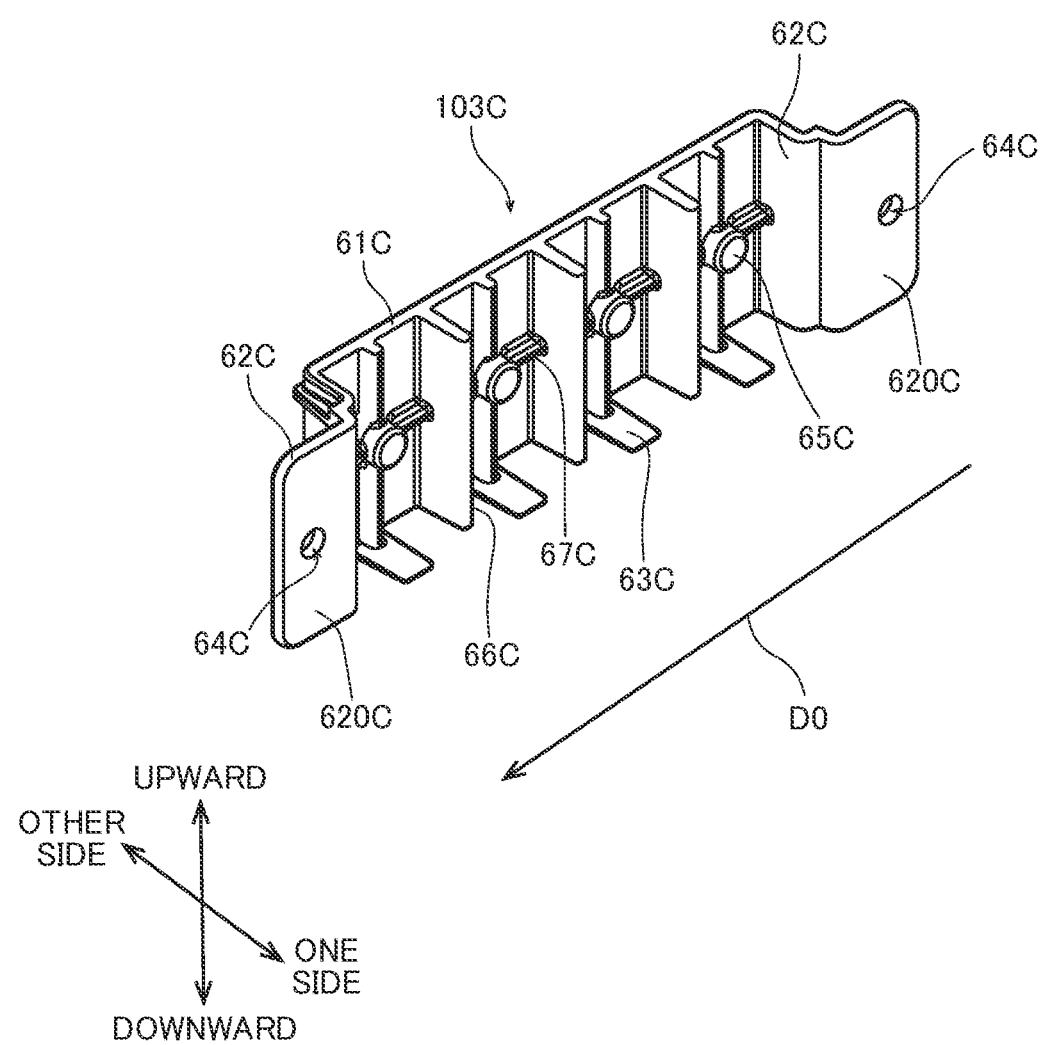
FIG. 8 is a perspective view of a cover according to the third embodiment.

FIG. 8 is a perspective view of the cover 103C according to the third embodiment. The cover 103C according to the present embodiment includes a cover body 61C, two cover protrusions 62C, a plurality of (in the present embodiment, four) cover bottom parts 63C, a plurality of (in the present embodiment, four) cover pressure parts 65C, a plurality of (in the present embodiment, three) cover side parts 66C, and a plurality of (in the present embodiment, sixteen) ribs 67C. The cover body 61C, the two cover protrusions 62C, the four cover bottom parts 63C, the four cover pressure parts 65C, the three cover side parts 66C, and the sixteen ribs 67C are formed of a single member. The cover 103C according to the present embodiment is made of a resin by injection molding. This enhances electrical isolation of the four heat generating elements 101C that are in contact with the cover 103C.

The cover body 61C is a plate-like portion that extends in the alignment direction D0 of the four heat generating elements 101C on the other side of the four heat generating elements 101C. The two cover protrusions 62C are portions each extending toward the one side from the opposite ends of the cover body 61C in the alignment direction D0. Each of the two cover protrusions 62C has a fixation face 620C. The fixation faces 620C extend in the alignment direction D0. Each of the two fixation faces 620C has a through hole 64C. As in the first and second embodiments, the four heat generating elements 101C are fixedly screwed to the heat sink 102C by one operation at opposite ends in the alignment direction D0 on the outer side of the four heat generating elements 101C, using the single cover 103C and two screws. Accordingly, a structure is formed in which the screws are not located on a path through which heat is transmitted from the four heat generating elements 101C to the heat sink 102C.

The four cover bottom parts 63C extend toward the one side and in a direction perpendicular to the cover body 61C from four positions of the lower end of the cover body 61C, which are spaced from one another in the alignment direction D0. When the cover 103C is fixed to the heat sink 102C, each of the four cover bottom parts 63C holds one heat generating element 101C on its upper face.

The four cover pressure parts 65C are portions each protruding toward the one side from positions of the cover body 61C that oppose the four heat generating elements 101C. The four cover pressure parts 65C protrude above the aforementioned cover bottom parts 63C. That is, the four cover pressure parts 65C protrude toward the one side from four positions spaced from one another in the alignment direction D0. In a pre-stage of the fixation of the cover 103C and the heat sink 102C, an adhesive 106C is applied in advance to at least either the tip ends of the cover pressure parts 65C on the one side or the faces of the four heat generating elements 101C on the other side.

When the cover 103C is fixed to the heat sink 102C, each of the four cover pressure parts 65C presses one of the heat generating elements 101C toward the one side. The cover 103C is in contact with the faces of the four heat generating elements 101C on the other side via the adhesive 106C. That is, the faces of the four heat generating elements 101C on the other side, which are parallel to the alignment direction D0, are in indirect contact with the cover body 61C via the adhesive 106C. As a result, the four heat generating elements 101C can be held in a more stable manner. This consequently further prevents the heat generating elements 101C from being disconnected or falling off.

The three cover side parts 66C protrude toward the one side from positions of the cover body 61C that oppose boundary portions of the four heat generating elements 101C. The three cover side parts 66C are plate-like portions that are contiguous with the one side of the cover body 61C and extend in the up-down direction and toward the one side.

The ribs 67C are portions that are contiguous with the one side of the cover body 61C and extend in the alignment direction D0 or in the up-down direction from the aforementioned four cover pressure parts 65C. The ribs 67C that extend in the alignment direction D0 each connects one cover pressure part 65C and one cover side part 66C. The ribs 67C that are located at the ends in the alignment direction D0 each connects one cover pressure part 65C and one cover protrusion 62C. In the present embodiment, sixteen ribs 67C are provided. The number of ribs 67C is however not limited thereto.

In particular, according to the present embodiment, the presence of the cover bottom parts 63C, the cover pressure parts 65C, the cover side parts 66C, and the ribs 67C enables more accurate positioning of each heat generating element 101C in the up-down direction and in the alignment direction D0 when the cover 103C is fixed to the heat sink 102C. More specifically, when the cover 103C is fixed to the heat sink 102C, each heat generating element 101C is arranged such that each cover pressure part 65C comes in contact with the vicinity of the center of the heat generating element 101C in the up-down direction and in the alignment direction D0. Accordingly, each of the four heat generating elements 101C can be disposed on the upper face of one of the cover bottom parts 63C and between two adjacent cover side parts 66C in the alignment direction D0 or between one cover side part 66C and one cover protrusion 62C that are adjacent to each other.

4. Variations

While exemplary embodiments of the present invention have been described thus far, the present invention is not intended to be limited to the above-described embodiments. The details of the shape and structure of the electronic control device may be appropriately changed without departing from the gist of the present invention.

Each element in the above-described embodiment and variations may be combined appropriately within a range in which no contradictions arise.

While the invention has been shown and described in detail, the foregoing description is in all aspects illustrative and not restrictive. It is therefore to be understood that numerous modifications and variations can be devised without departing from the scope of the invention.

What is claimed is:

1. Electronic equipment comprising:
   a plurality of heat generating elements arranged adjacent to one another in a one-dimensional array in a predetermined alignment direction, the plurality of heat generating elements having first faces parallel to the predetermined alignment direction and second faces opposite the first faces;
   a single heat sink fixed directly or indirectly to the first faces of the plurality of heat generating elements; and
   a single piece cover that is formed from a single component, and has a first end part, a second end part opposite the first end part, and a cover body extending from the first end part to the second end part in the predetermined alignment direction to cover the second faces of the plurality of heat generating elements, the cover body having a center portion, a first portion between the first end part and the center portion, and a second portion between the center portion and the second end part,
   wherein the cover body is in direct or indirect contact with the second faces of the plurality of heat generating elements,
   wherein the single piece cover is fixedly screwed to the single heat sink at the first end part and the second end part, and wherein the plurality of heat generating elements are sandwiched and held between the single heat sink and the single piece cover, wherein the cover body has a first edge and a second edge opposite the first edge, the first edge and the second edge extending between the first portion and the second portion in the predetermined alignment direction, wherein the cover body has an extending part extending from one of the first edge and the second edge in a direction toward the single heat sink so that the extending part reinforces the cover body, wherein the cover body is curved overall (1) so that the center portion is closer to the single heat sink than the first and second portions and (2) so that the one of the first edge and the second edge is curved overall in order for the extending part to be curved overall, wherein the cover body further includes, as parts of the cover body, a plurality of cover pressure parts protruding toward the plurality of heat generating elements, the plurality of cover pressure parts being arranged in the predetermined alignment direction and being spaced from one another, and wherein the plurality of cover pressure parts each press a corresponding one of the plurality of heat generating elements.

2. The electronic equipment according to claim 1, wherein the first end part and the second end part extend toward the single heat sink, and
wherein the first end part and the second end part are screwed to the single heat sink.

3. The electronic equipment according to claim 1, wherein the single piece cover is made of a metal.

4. An electronic control device comprising:
a circuit board implementing the electronic equipment according to claim 1; and
a case housing the circuit board.

* * * * *